United States Patent
Liu et al.

(12)

(10) Patent No.: US 7,106,226 B2
(45) Date of Patent: Sep. 12, 2006

(54) DETERMINATION OF KEY BIT POSITIONS IN GRAY CODES

(75) Inventors: Pi-Hai Liu, Taipei (TW); Jia-Horng Shieh, Jhonghe (TW)

(73) Assignee: MediaTek, Inc., Hsin-Chu (TW)

( * ) Notice: Subject to any disclaimer, the term of this patent is extended or adjusted under 35 U.S.C. 154(b) by 0 days.

(21) Appl. No.: 10/951,419

(22) Filed: Sep. 28, 2004

(65) Prior Publication Data

US 2006/0066461 A1     Mar. 30, 2006

(51) Int. Cl.
    *H03M 7/04*    (2006.01)
(52) U.S. Cl. ..................................... 341/97

(58) Field of Classification Search .................. 341/97, 341/98, 50
See application file for complete search history.

(56) References Cited

U.S. PATENT DOCUMENTS

| 6,337,893 B1 * | 1/2002 | Pontius | 377/108 |
| 6,703,950 B1 * | 3/2004 | Yi | 341/97 |

* cited by examiner

*Primary Examiner*—Peguy JeanPierre
(74) *Attorney, Agent, or Firm*—Fish & Richardson P.C.

(57) ABSTRACT

A key bit position of a first Gray code is determined based on the bit values of the first Gray code. The first Gray code and a second Gray code that differs from the first Gray code only in the key bit position correspond to two associated numbers that differ by one.

53 Claims, 16 Drawing Sheets

| Binary code | Gray code |
|---|---|
| 0000 | 0000 |
| 0001 | 0001 |
| 0010 | 0011 |
| 0011 | 0010 |
| 0100 | 0110 |
| 0101 | 0111 |
| 0110 | 0101 |
| 0111 | 0100 |
| 1000 | 1100 |
| 1001 | 1101 |
| 1010 | 1111 |
| 1011 | 1110 |
| 1100 | 1010 |
| 1101 | 1011 |
| 1110 | 1001 |
| 1111 | 1000 |

FIG. 1

| Binary code | Gray code |
|---|---|
| 0000 | 000<u>0</u> |
| 0001 | 000<u>1</u> |
| 0010 | 001<u>1</u> |
| 0011 | 001<u>0</u> |
| 0100 | 011<u>0</u> |
| 0101 | 011<u>1</u> |
| 0110 | 010<u>1</u> |
| 0111 | 010<u>0</u> |
| 1000 | 1<u>1</u>00 |
| 1001 | 1<u>1</u>01 |
| 1010 | 111<u>1</u> |
| 1011 | 111<u>0</u> |
| 1100 | 1<u>0</u>10 |
| 1101 | 101<u>1</u> |
| 1110 | 100<u>1</u> |
| 1111 | <u>1</u>000 |

FIG. 2

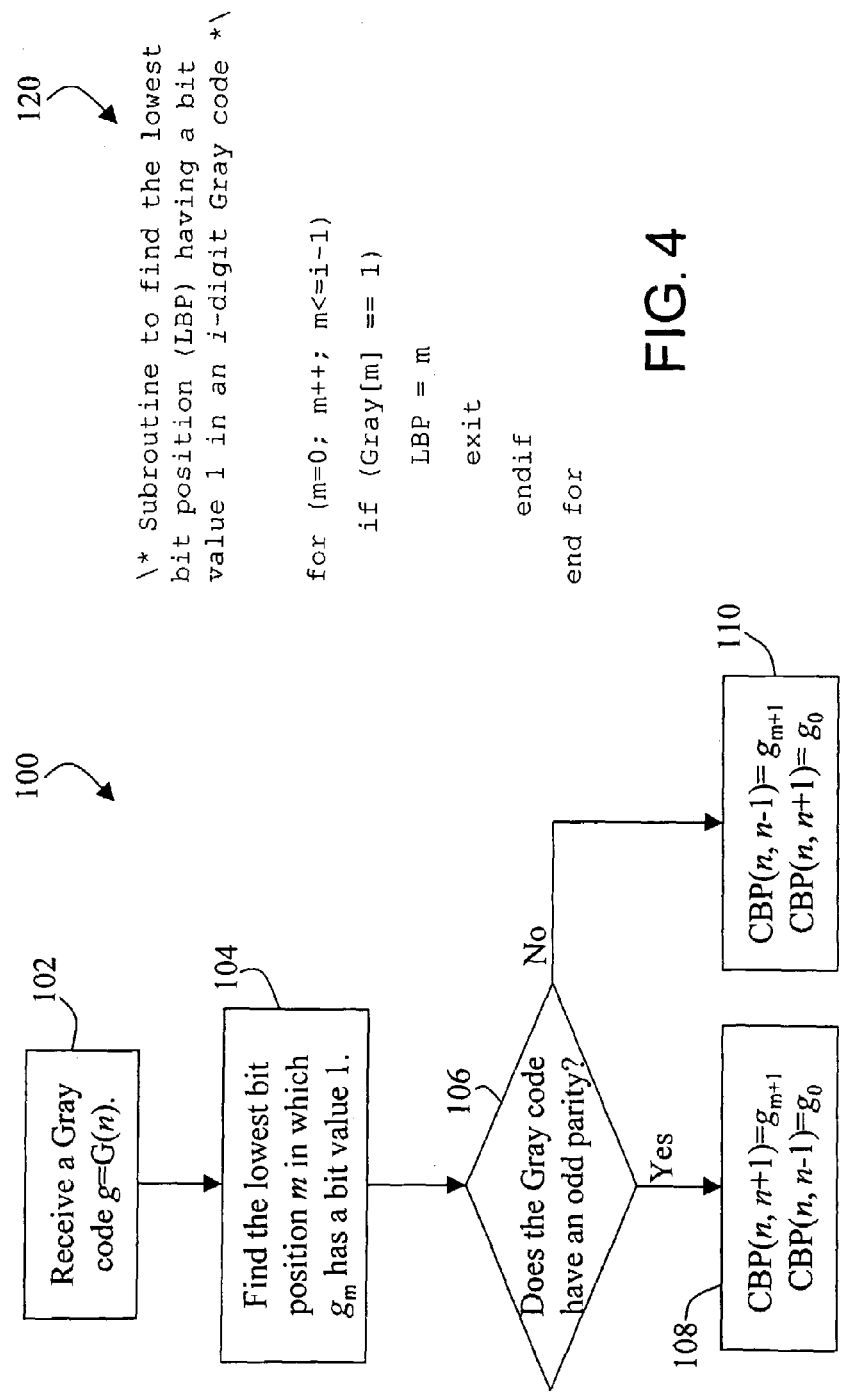

```
\* Subroutine to find "011..."
pattern in binary number b *\

CBP = 0
for (m=0; m++; m<=11)
    if (b[m]==0)
        CBP=m
        exit
    endif
end for
```

FIG. 15

```
\* Subroutine to find "100..."
pattern in binary number b *\

CBP=0
for (m=0; m++; m<=11)
    if (b[m]==1)
        CBP = m
        exit
    endif
end for
```

FIG. 14

\*Subroutine to find "100..." or "011..." pattern in binary number b*\

```
CBP=0
for (m=0; m++; m<=11)
    if  (b[m] != b[0])
    CBP = m
    exit
    endif
end for
```

FIG. 16

```
\* Subroutine to find whether a specified bit
position is a change bit position *\ for (m=0; m++; m<=11)
   x=g[m]
   set g[m]=1
      decode g to generate B_1
   set g[m]=0
      decode g to generate B_0
   if abs(B_1 – B_0)=1
      CBP=m
   else
      g[m]=x
   end if
end for
```

| Binary code | Gray code |
|---|---|
| 0000 | 1111 |
| 0001 | 1110 |
| 0010 | 1100 |
| 0011 | 1101 |
| 0100 | 1001 |
| 0101 | 1000 |
| 0110 | 1010 |
| 0111 | 1011 |
| 1000 | 0011 |
| 1001 | 0010 |
| 1010 | 0000 |
| 1011 | 0001 |
| 1100 | 0101 |
| 1101 | 0100 |
| 1110 | 0110 |
| 1111 | 0111 |

FIG. 20

DETERMINATION OF KEY BIT POSITIONS IN GRAY CODES

BACKGROUND

This description relates to determination of key bit positions in Gray codes.

Gray codes are useful in information and communication systems. In one example, a sequence of N binary Gray codes are used to represent a sequence of N binary numbers according to a one-to-one mapping relationship, N being an integer. FIG. 1 shows an example of a sequence of Gray codes that maps to a sequence of binary numbers 0000 to 1111. Adjacent binary numbers n and n+1 (or n and n−1) are represented by Gray codes that differ by a single digit. A Gray code can be generated by using exclusive-OR operations on bit values of a corresponding binary number. For example, for a 12-bit binary number expressed as $b=(b_{11}, b_{10}, b_9, b_8, b_7, b_6, b_5, b_4, b_3, b_2, b_1, b_0)$, the corresponding 12-bit Gray code expressed as $g=(g_{11}, g_{10}, g_9, g_8, g_7, g_6, g_5, g_4, g_3, g_2, g_1, g_0)$ can be determined as follows:

$$g_{11} = b_{11}$$

$$g_m = b_m \oplus b_{m+1}, \text{ for } m=0, 1, 2, \ldots, 10.$$

The most significant bit of a gray code (e.g., $g_{11}$) is the same as the most significant bit (e.g., $b_{11}$) of the corresponding binary number. Each of the other bits (e.g., $g_m$) of the Gray code can be calculated from the exclusive-OR value of the corresponding bit (e.g., $b_m$) in the binary number and the bit (e.g., $b_{m+1}$) that is one digit higher than the corresponding bit.

A binary number b can be decoded from a corresponding Gray code g by using exclusive-OR operations. In the example above, given the Gray code g, the corresponding binary number b can be determined as follows:

$$b_{11} = g_{11}$$

$$b_m = g_m \oplus b_{m+1} = g_m \oplus g_{m+1} \oplus \ldots \oplus g_{11}, \text{ for } m=0, 1, 2, \ldots, 10.$$

The most significant bit (e.g., $b_{11}$) of the binary number is the same as the most significant bit (e.g., $g_{11}$) of the corresponding Gray code. Each of the other bits (e.g., $b_m$) of the binary number is calculated from the exclusive-OR value of its corresponding bit (e.g., $g_m$) in the Gray code and the bit (e.g., $b_{m+1}$) that is one digit higher in the binary number. The $m^{th}$ bit of the binary number (other than the most significant bit) can also be calculated as the exclusive-OR value of all bits of the Gray code having bit positions equal to or higher than m.

SUMMARY

In one aspect, the invention features a method that includes determining a key bit position of a first Gray code for which the first Gray code and a second Gray code that differs from the first Gray code only in the key bit position correspond to two associated numbers that differ by one. The determination of the key bit position is based on the bit values of the first Gray code.

Implementations of the invention may include one or more of the following features. The first and second Gray codes are associated with the two numbers based on a predetermined mapping. The first and second Gray codes belong to a set of Gray codes each associated with one of a sequence of numbers according to the predetermined mapping. In one example, the key bit position is not the least significant bit position. In another example, the key bit position is the least significant bit position. The key bit position is determined from the bit values of the first Gray code without reference to the number associated with the Gray code.

The Gray code has i bits, the (i−1)-th bit position being the highest bit position and the 0-th bit being the lowest bit position, and wherein determining the key bit position includes finding an m-th bit position, so that a bit value at the m-th bit position is equal to 1 and the bit values at all lower bit positions are equal to 0. The key bit position is the (m+1)-th bit position. The number associated with the second Gray code is one higher or one lower than the number associated with the first Gray code.

In another aspect, the invention features a method that includes determining a key bit position of a first Gray code for which the first Gray code and a second Gray code that differs from the first Gray code only in the key bit position correspond to two associated numbers that differ by one. A second Gray code is generated by changing a bit value at the key bit position of the first Gray code.

Implementations of the invention may include one or more of the following features. The first and second Gray codes are associated with the two numbers based on a predetermined mapping. The first and second Gray codes belong to a set of Gray codes each associated with one of a sequence of numbers according to the predetermined mapping. The key bit position of the first Gray code is determined so that the number associated with the first Gray code is one higher or one lower than the number associated with the second Gray code.

In another aspect, the invention features a method that includes finding a particular bit position in a Gray code other than the least significant bit position that has a bit value different from the values of bits in all lower bit positions.

Implementations of the invention may include one or more of the following features. In one example, the particular bit position has a bit value 1, and all lower bit position values have bit values 0. In another example, the particular bit position has a bit value 0, and all lower bit positions have bit values 1. The method includes assigning a key bit position as being one bit higher than the particular bit position in the Gray code. The method includes generating a second Gray code by changing a bit value at a bit position that is one bit higher than the particular bit position of the first Gray code.

In another aspect, the invention features a method that includes deriving a binary number from a Gray code based on a predetermined mapping, and finding a particular bit position in the binary number so that bit values at all bit positions lower than the particular bit position are different than the bit value of the particular bit position.

Implementations of the invention may include one or more of the following features. The method includes assigning the particular bit position as a key bit position. The binary number changes by one when the bit value at the particular bit position of the Gray code changes. The binary number is derived from the Gray code by using exclusive-OR operations.

The Gray code and the binary number both have i+1 digits, the binary number being derived from the Gray code using equations: $b_i = g_i$ and $b_m = g_m \oplus b_{m+1}$ or $b_m = g_m \oplus g_{m+1} \oplus \ldots \oplus g_i$, for $m=0, 1, 2, \ldots, i-1$, and wherein the Gray code has bit values $g_i, g_{i-1}, g_{i-2}, \ldots, g_2, g_1$, and $g_0$, and the binary number has bit values $b_i, b_{i-1}, b_{i-2}, \ldots, b_2$, $b_1$, and $b_0$. The binary number has bit values $b_i$, $b_{i-1}$, $b_{i-2}$, ..., $b_2$, $b_1$, and $b_0$. In one example, finding the particular bit position includes finding a p-th bit position in the binary number so that bit values $(b_p, b_{p-1}, b_{p-2}, \ldots, b_1, b_0)$ are $(0, 1, 1, \ldots, 1, 1)$. In another example, finding the bit position includes finding a p-th bit position in the binary number so that bit values $(b_p, b_{p-1}, b_{p-2}, \ldots, b_1, b_0)$ are $(1, 0, 0, \ldots, 0, 0)$. In one example, the method includes using registers in which a p-th register associated with $b_p$ outputs a value p when bit values $(b_p, b_{p-1}, b_{p-2}, \ldots, b_1, b_0)$ are $(0, 1, 1, \ldots, 1, 1)$. In another example, the method includes using registers in which a p-th register associated with $b_p$ outputs a value p when bit values $(b_p, b_{p-1}, b_{p-2}, \ldots, b_1, b_0)$ are $(1, 0, 0, \ldots, 0, 0)$, p being an integer, $1 \leq p \leq i$.

In another aspect, the invention features a method that includes deriving a binary number from a first Gray code based on a predetermined mapping, and determining a key bit position of the first Gray code based on bit values of the binary number.

Implementations of the invention may include one or more of the following features. The first Gray code is a member of a set of Gray codes each associated with one of a sequence of binary numbers according to the predetermined mapping. The first Gray code and a second Gray code that differs from the first Gray code only in the key bit position correspond to two associated binary numbers that differ by one. In one example, the key bit position is not the least significant bit position. In another example, the key bit position is the least significant bit position. The key bit position is determined from the bit values of the binary number without reference to the Gray code.

In another aspect, the invention features a method that includes deriving a first binary number from a first Gray code, deriving a second binary number from a second Gray code that differs from the first Gray code only at a single bit position, and determining whether a difference between the first and second binary numbers is equal to one.

Implementations of the invention may include one or more of the following features. The method includes assigning the single bit position as a key bit position if the difference between the first and second binary numbers is equal to one.

In another aspect, the invention features a method that includes, for a first binary number, determining a key bit position of a first Gray code based on bit values of the first binary number, the first binary number being associated with the first Gray code according to a predetermined mapping. The first Gray code and a second Gray code that differs from the first Gray code only in the key bit position correspond to the first binary number and a second binary number, respectively, the first and second binary numbers differing by one.

Implementations of the invention may include one or more of the following features. The first and second Gray codes belong to a set of Gray codes each associated with one of a sequence of binary numbers according to the predetermined mapping. The first binary number is one higher or one lower than the second binary number.

In another aspect, the invention features a method that includes finding a particular bit position in a binary number so that bit values of the binary number at all bit positions lower than the particular bit position are different than the bit value of the particular bit position.

Implementations of the invention may include the following feature. The method includes assigning the particular bit position as a key bit position of a Gray code associated with the binary number according to a predetermined mapping.

In another aspect, the invention features an apparatus that includes a key bit position detector to determine a key bit position in a first Gray code based on bit values of the first Gray code. The first Gray code and a second Gray code that differs from the first Gray code only in the key bit position correspond to two associated numbers that differ by one.

Implementations of the invention may include one or more of the following features. The first and second Gray codes are associated with the two numbers according to a predetermined mapping. The apparatus includes a Gray code generator to generate the second Gray code by changing a bit value at the key bit position of the first Gray code. The key bit position detector includes a module to find a particular bit position in the first Gray code so that a bit value at the particular bit position is different from bit values at all lower bit positions. In one example, the particular bit position has a bit value 1, and all lower bit positions have bit values 0. In another example, the particular bit position has a bit value 0, and all lower bit positions have bit values 1. The key bit position is determined to be one bit higher than the particular bit position. The key bit position detector determines the key bit position of the first Gray code from the bit values of the first Gray code without reference to the number associated with the Gray code.

In another aspect, the invention features an apparatus that includes a key bit position detector to determine a key bit position in a first Gray code based on bit values of a first binary number that is associated with the first Gray code according to a predetermined mapping. The first Gray code and a second Gray code that differs from the first Gray code only in the key bit position correspond to the first binary number and a second binary number, respectively, the first and second binary numbers differing by one.

Implementations of the invention may include one or more of the following features. The key bit position detector includes a Gray-to-binary decoder to derive a binary number from a Gray code. The key bit position detector includes a module to find a particular bit position in the binary number such that all bit positions lower than the particular bit position have bit values that are different from a bit value at the particular bit position. The binary number has bit values $b_i$, $b_{i-1}$, $b_{i-2}$, ..., $b_2$, $b_1$, and $b_0$, and the key bit position detector includes registers. In one example, the p-th register associated with $b_p$ outputs a value p when bit values $(b_p, b_{p-1}, b_{p-2}, \ldots, b_1, b_0)$ are $(0, 1, 1, \ldots, 1, 1)$. In another example, the p-th register associated with $b_p$ outputs a value p when bit values $(b_p, b_{p-1}, b_{p-2}, \ldots, b_1, b_0)$ are $(1, 0, 0, \ldots, 0, 0)$, p being an integer, $1 \leq p \leq i$.

In another aspect, the invention features an apparatus that includes one or more Gray-to-binary decoders to derive a first binary number from a first Gray code and a second binary number from a second Gray code that is different from the first Gray code by a single digit, and a difference detector to determine a difference between the first and second binary numbers. The difference detector determines whether the difference is equal to 1.

Implementations of the invention may include the following feature. The first and second binary numbers are derived from the first and second Gray codes, respectively, according to a predetermined mapping.

In another aspect, the invention features an apparatus that includes a signal line to receive a first Gray code, and means for determining a key bit position of the first Gray code, in which the first Gray code and a second Gray code that differs from the first Gray code only in the key bit position correspond to two associated numbers that differ by one.

Implementations of the invention may include one or more of the following features. The key bit position is determined based on bit values of the Gray code or based on bit values of one of the two associated numbers that is associated with the first Gray code.

DESCRIPTION OF DRAWINGS

FIGS. 1, 2, and 20 each shows a sequence of Gray codes associated with a sequence of binary numbers.

FIGS. 3 and 13 show processes.

FIGS. 4, 14–17 show software subroutines.

DESCRIPTION

Figure 5:
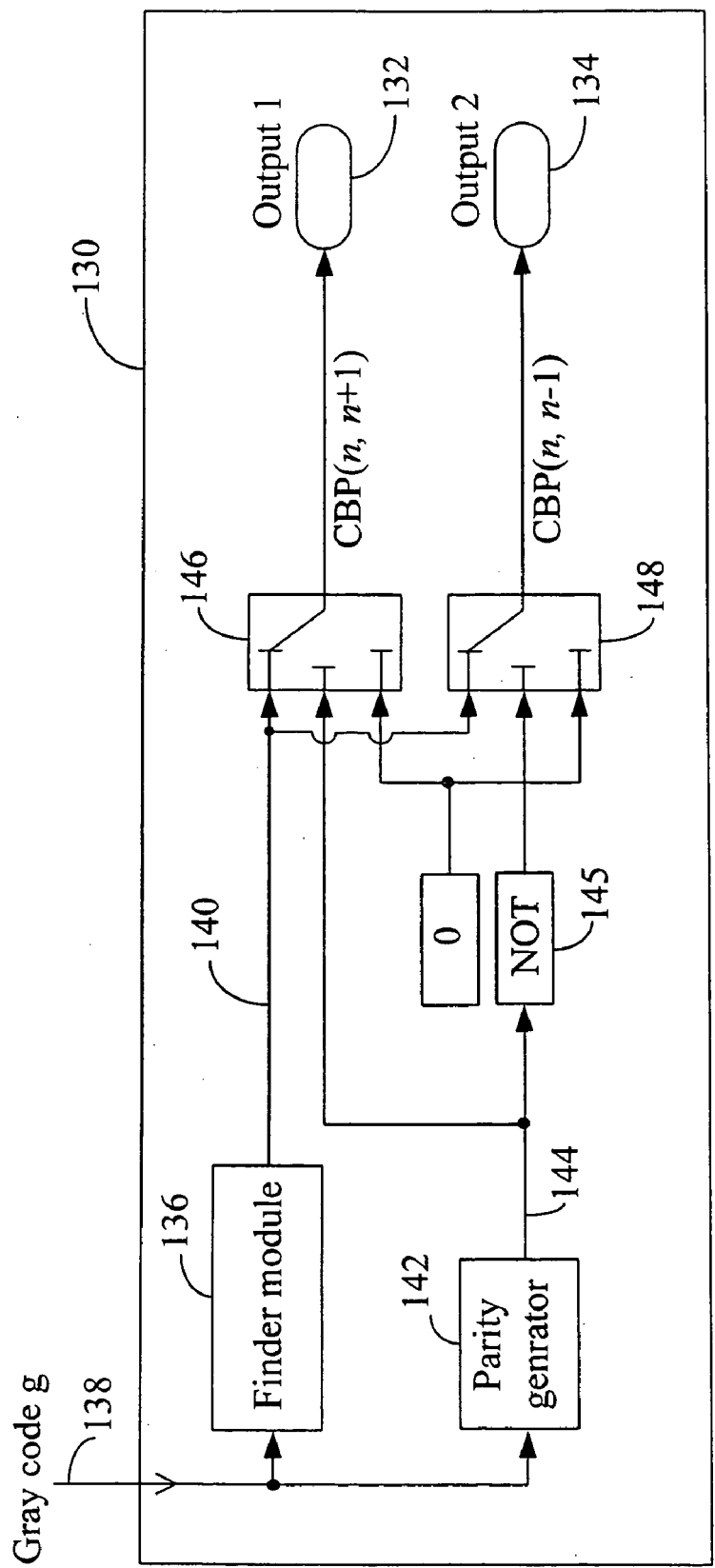
FIGS. 5, 7, 11, and 12 show key bit positions finders.

A key bit position of a Gray code refers to a bit position for which a change in its bit value corresponds to a change of one in the corresponding binary number. For example, FIG. 2 shows the sequence of Gray codes and the corresponding sequence of binary numbers in FIG. 1, with the key bit positions of the Gray codes underlined. Key bit positions of a Gray code can be determined by, for example, evaluating the bit values of the Gray code, or by evaluating the bit values of the corresponding binary code.

In the following, a description of the key bit positions of a Gray code is given first, followed by a description of the methods for determining, from a given Gray code, the key bit positions of that Gray code. The term "key bit position" is also referred to as the "change bit position."

Key Bit Positions

In the description below, a sequence of N Gray codes are used to represent a sequence of N binary numbers, where $N=2^i$. Each Gray code has i digits, expressed as $g=(g_{i-1}, g_{i-2}, \ldots, g_2, g_1, g_0)$, and each binary number has i digits, expressed as $b=(b_{i-1}, b_{i-2}, \ldots, b_2, b_1, b_0)$. The bit value $g_0$ will be referred to as being at the $0^{th}$ bit position of the Gray code, and $g_1$ will be referred to as being at the $1^{st}$ bit position of the Gray code, and so forth. Each Gray code can be derived from a corresponding binary number by using equations:

$$g_{i-1}=b_{i-1} \quad \text{(Equ. 1)}$$

$$g_m=b_m \oplus b_{m+1}, \text{ for } m=0, 1, 2, \ldots, i-2. \quad \text{(Equ. 2)}$$

Given a Gray code $g=(g_{i-1}, g_{i-2}, \ldots, g_2, g_1, g_0)$, the corresponding binary code $b=(b_{i-1}, b_{i-2}, \ldots, b_2, b_1, b_0)$ can be derived by using equations:

$$b_{i-1}=g_{i-1} \quad \text{(Equ. 3)}$$

$$b_m=g_m \oplus b_{m+1}=g_m \oplus g_{m+1} \oplus \ldots \oplus g_i, \text{ for } m=0, 1, 2, \ldots, i-2. \quad \text{(Equ. 4)}$$

The Gray code that represents a binary number n will be written as G(n). Adjacent numbers n and n+1 (or n and n−1) are represented by Gray codes G(n) and G(n+1) (or G(n) and G(n−1)) that differ by one digit.

As show in FIG. 2, each Gray code has two "key bit positions." When the bit value at a key bit position changes, either from 0 to 1 or from 1 to 0, the binary value represented by the Gray code increments or decrements by one.

For example, the binary number 1011 is represented by a Gray code G(11)=1110. The binary number 1100 (which is 1011 plus one) is represented by a Gray code G(12)=1010. The binary number 1010 (which is 1011 minus one) is represented by a Gray code G(10)=1111. The Gray codes 1010 and 1111 differ from the Gray code 1110 at the $2^{nd}$ and $0^{th}$ bit positions, respectively. Thus, for the Gray code 1110, the key bit positions are the $0^{th}$ and $2^{nd}$ bit positions.

As another example, a Gray code $g_1$=0011,0101,1000 represents the binary number $b_1$=0010,0110,1111. When the binary number $b_1$ increments by one and becomes $b_2$=0010, 0111,0000, the corresponding Gray code becomes $g_2$=0011, 0100,1000, which differs from the Gray code $g_1$ at the $4^{th}$ bit position. When the binary number $b_1$ decrements by one and becomes $b_3$=0010,0110,1110, the corresponding Gray code becomes $g_3$=0011,0101,1001, which differs from the Gray code $g_1$ at the $0^{th}$ bit position. Thus, the $0^{th}$ and $4^{th}$ bit positions are the key bit positions of the Gray code $g_1$=0011, 0101,1000.

A sequence of Gray codes that are generated using Equs. 1 and 2 (such as the example shown in FIG. 2) is cyclic, in that the last Gray code (e.g., 1000) in the sequence of Gray codes differs from the first Gray code (e.g., 0000) in the sequence of Gray codes by one digit.

For a Gray code G(n) that represents a binary number n, when the bit value at one of the key bit positions changes, the corresponding binary number changes from n to n+1. This key bit position will be represented as CBP(n, n+1). When the bit value at the other key bit position changes, the corresponding binary number changes from n to n−1. This key bit position will be represented as CBP(n, n−1). Similarly, CBP(n+1, n) will be used to represent the key bit position of a Gray code G(n+1), in which when the bit value at the key bit position changes, the corresponding binary number changes from n+1 to n. CBP(n−1, n) will be used to represent the key bit position of a Gray code G(n−1), in which when the bit value at the key bit position changes, the corresponding binary number changes from n−1 to n.

In the example of FIG. 2, the Gray code G(0) (which represents binary number 0) has all bit values equal to 0, and the Gray code G(N−1) (which represents the binary number N−1) has all bit values equal to 0 except the most significant bit (e.g., G(N−1)=1000 . . . 000). For these two Gray codes, the key bit positions are the $0^{th}$ bit and the most significant bit.

For all Gray codes other than G(0) and G(N−1), one of the key bit positions is at the $0^{th}$ bit position, and the other key bit position can be determined using, for example, two methods described below.

Method 1 of Finding Key Bit Positions

In the first method, the key bit position of a Gray code is determined from the bit values of the Gray code by finding the lowest bit position k in the Gray code that has a bit value 1. The (k+1)-th bit position will be a key bit position.

For example, in the Gray code $g_1$=0011,0101,1001, the lowest bit position having a bit value 1 is the $0^{th}$ bit position, so the $1^{st}$ bit position is a key bit position. Thus, $g_1$ has key bit positions at the $0^{th}$ and $1^{st}$ bit positions. In the Gray code $g_2$=0011,0101,1000, the lowest bit position having a bit value 1 is the $3^{rd}$ bit position, so the $4^{th}$ bit position is a key bit position. Thus, $g_2$ has key bit positions at the $0^{th}$ and $4^{th}$ bit positions.

If $g_m$ is the lowest bit position that has a bit value 1, and the $0^{th}$ bit of the corresponding binary number (i.e., $b_0$) has a bit value 1, then $CBP(n, n-1)=g_0$ and $CBP(n, n+1)=g_{m+1}$. This means that if the bit value $g_0$ changes, the corresponding binary number will change from n to n−1, and if the bit value $g_{m+1}$ changes, the corresponding binary number will change from n to n+1.

If $g_m$ is the lowest bit position that has a bit value 1, and the $0^{th}$ bit of the corresponding binary number (i.e., $b_0$) has a bit value 0, then $CBP(n, n+1)=g_0$, and $CBP(n, n-1)=g_{m+1}$. This means that if the bit value $g_0$ changes, the corresponding binary number will change from n to n+1, and if the bit value $g_{m+1}$ changes, the corresponding binary number will change from n to n−1.

When the parity of g is odd, i.e., there is an odd number of 1's in the Gray code g, the $0^{th}$ bit of the corresponding binary code will have a bit value 1, i.e., $b_0=1$. When the parity of g is even, i.e., there is an even number of 1's in the Gray code g, the corresponding binary code will have a bit value 0, i.e., $b_0=0$.

Thus, if a Gray code g has an odd parity, and $g_m$ is the lowest bit position that has a bit value 1, then $CBP(n, n-1)=g_0$ and $CBP(n, n+1)=g_{m+1}$. If a Gray code g has an even parity, and $g_m$ is the lowest bit position that has a bit value 1, then $CBP(n, n+1)=g_0$ and $CBP(n, n-1)=g_{m+1}$.

Knowing the key bit positions and whether a change in value at a key bit position will result in an increase or decrease of the corresponding binary numbers are useful in error correction. For example, suppose a pair of Gray codes $g_1=G(n)$ and $g_2=G(n+1)$ are received, and based on an error detection technique (such as parity bits), it is determined that the Gray code $g_1$ contains an error but the Gray code $g_2$ is correct. One way to restore $g_1$ to its correct value is to determine which bit position in $g_2$ is $CBP(n+1, n)$, such that a change in the bit value of the key bit position results in the corresponding binary number to change from n+1 to n. The number $g_1$ can be restored without converting $g_2$ to the corresponding binary code $b_2$, minus 1, and converting back to Gray code $g_1$.

Similarly, suppose a pair of Gray codes $g_1=G(n-1)$ and $g_2=G(n)$ are received, and based on error detection technique (such as parity bits) it is known that the Gray code $g_2$ contains an error but the Gray code $g_1$ is correct. One way to restore $g_2$ to its correct value is to determine which bit position in $g_1$ is $CBP(n-1, n)$, such that a change in bit value of the key bit position results in the corresponding binary number to change from n−1 to n. The number $g_2$ can be restored without converting $g_1$ to the corresponding binary code $b_1$, adding 1, and converting back to the Gray code $g_2$.

FIG. 3 shows an example of a process 100 for determining key bit positions of a Gray code g. A Gray code g=G(n) is received (102). The lowest bit position m in which $g_m$ has a bit value 1 is found (104). The parity of the Gray code is determined (106). If the Gray code has an odd parity, then CBP(n, n+1) is determined (108) to be $g_{m+1}$, and CBP(n, n−1) is determined to be $g_0$. If the Gray code has an even parity, then CBP(n, n−1) is determined (110) to be $g_{m+1}$, and CBP(n, n+1) is determined to be $g_0$.

FIG. 4 shows an example of a software subroutine 120 for finding (104) the lowest bit position having a bit value 1.

FIG. 5 shows an example of a key bit positions detector 130 that generates a first output 132 that represents the key bit position CBP(n, n+1), and a second output 134 that represents the key bit position CBP(n, n−1). A finder module 136 receives a Gray code g on a signal line 138 and finds the bit position that is one digit higher than the lowest bit position having a bit value 1. The bit position is output on a signal line 140. A parity generator 142 determines the parity of the Gray code g. The parity generator 142 outputs a parity signal on a signal line 144 to determine which signals are selected by 2-to-1 multiplexers 146 and 148. If the parity signal on line 144 is equal to 1, the multiplexer 146 selects the output on the line 140 as CBP(n, n+1), and the multiplexer 148 selects 0 as CBP(n, n−1). If the parity signal on line 144 is equal to 0, the multiplexer 146 selects 0 as CBP(n, n+1), and the multiplexer 148 selects the output on the line 140 as CBP(n, n−1).

Figure 6:
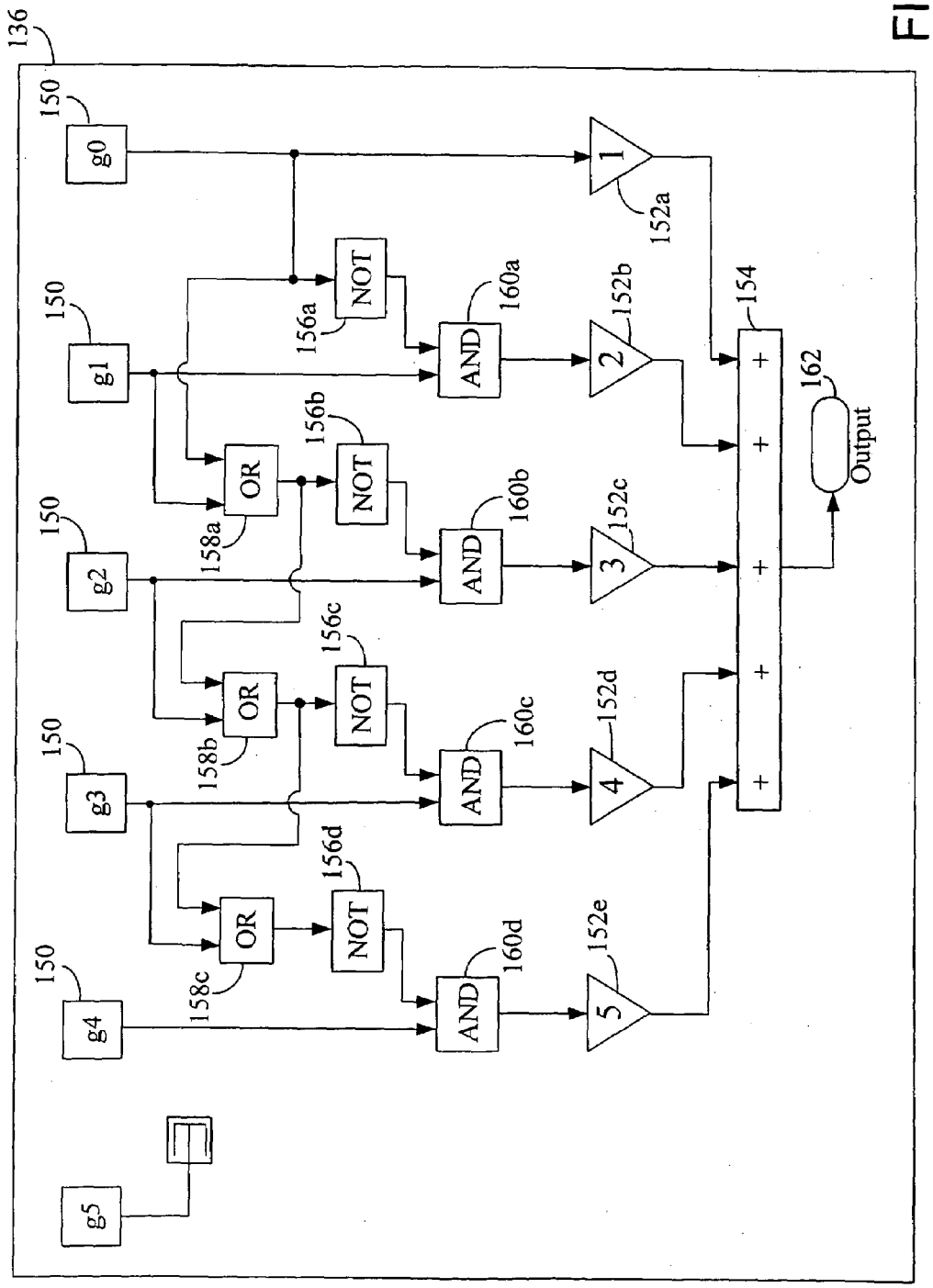
FIG. 6 shows a finder module.

FIG. 6 shows an example of the finder module 136 for finding a bit position in a 6-digit Gray code that is one digit higher than the lowest bit position having a bit value 1. The finder module 136 includes 6 registers 150 to store the 6 bit values of the Gray code, $g_0$ to $g_5$. Consider a situation in which $g_0$ is equal to 1. A register 152a, connected to register $g_0$, outputs 1 to an adder 154. A NOT gate 156a connected to $g_0$ outputs 0, causing an AND gate 160a to output 0, which in turn causes register 152b to output 0. Similarly, $g_0=1$ causes an OR gate 158a to output 1, a NOT gate 156b to output 0, an AND gate 160b to output 0, and a register 152c to output 0. The registers 152d and 152e also output 0. The adder 154 generates an output 162 that is equal to 1, indicating that the $1^{st}$ bit position is a key bit position.

Consider a situation in which $g_0=0$ and $g_1=1$. The register 152a will output 0. The AND gate 160a will output 1, causing register 152b to output 2, which is sent to the adder 154. The bit value $g_1=1$ causes the AND gates 160b, 160c, and 160d to output 0, causing the registers 152c, 152d, and 152e to output 0. The output 162 of the adder 154 will be equal to 2, indicating that the $2^{nd}$ bit position is a key bit position.

Consider the situation in which $g_0=0$, $g_1=0$, and $g_2=1$. Registers 152a and 152b will output 0. The AND gate 160b will output 1, causing register 152c to output 3, which is sent to the adder 154. The bit value $g_2=1$ causes AND gates 160c and 160d to output 0. The output 162 of the adder 154 will be equal to 3, indicating that the $3^{rd}$ bit position is a key bit position.

Depending on the values of $g_0$, $g_1$, $g_2$, $g_3$, and $g_4$, one of the registers 152a to 152e will output a number that is one digit higher than the first one to have a bit value 1, with the other registers outputting 0. The output 162 of the adder 154 will be a number that represents the key bit position.

Consider the situation in which $g_0$, $g_1$, $g_2$, $g_3$, and $g_4$ all are 0. The value of $g_5$ can be 0 or 1 so that g represents G(0) or G(N−1), respectively. The output 162 of the adder 154 will be 0, which represents one of the key bit positions.

As previously mentioned, a sequence of Gray codes is cyclic, in that the last Gray code G(N−1) in the sequence differs form the first Gray code G(0) in the sequence by one digit (e.g., the most significant digit). The finder module 136 can be modified to output the most significant digit when g represents G(0) or G(N−1). In this example, it is assumed that the $0^{th}$ bit is the other key bit position.

Method 2 for Finding Key Bit Positions

The second method for finding a key bit position of a Gray code expressed as $g=(g_{i-1}, g_{i-2}, \ldots, g_2, g_1, g_0)$ involves deriving a binary number b expressed as $b=(b_{i-1}, b_{i-2}, \ldots, b_1, b_1, b_0)$ from the Gray code g, and finding a bit position p such that the bit positions in the binary number b below the $p^{th}$ bit position are complementary to the bit value at the $p^{th}$ bit position. Here, the number 0 is complementary to the number 1, and vice versa. This involves finding a bit pattern in the binary number b such that $(b_p, \ldots, b_0)=(0, 1, 1, \ldots, 1)$ or $(1, 0, 0, \ldots, 0)$. The $p^{th}$ bit position in the Gray code then is a key bit position.

The following is a theoretical explanation for the second method. When the bit value $g_p$ at the key bit position p of the Gray code g changes to its complementary value (i.e., from 0 to 1 or from 1 to 0), the bit values ($b_p$, ..., $b_0$) of the corresponding binary number b will change. Because $b_m = g_m \oplus b_{m+1}$ (see Equ. 4), if the bit value of $g_p$ changes, all of the bit values of $b_0$ to $b_p$ will also change. In other words, if the $p^{th}$ bit of g is changed to its complementary value, such that $g'=(g_{i-1}, g_{i-2}, \ldots, g_{p+1}, \tilde{g}_p, g_{p-1}, \ldots, g_3, g_2, g_1, g_0)$, the corresponding binary number will become $b'=(b_{i-1}, b_{i-2}, \ldots, b_{p+1}, \bar{b}_p, \bar{b}_{p-1}, \ldots, \bar{b}_3, \bar{b}_2, \bar{b}_1, \bar{b}_0)$. To satisfy the condition that b and b' differ by 1, the bit values ($b_p$, ..., $b_0$) is either (0, 1, ..., 1) or (1, 0, ..., 0).

Figure 7:
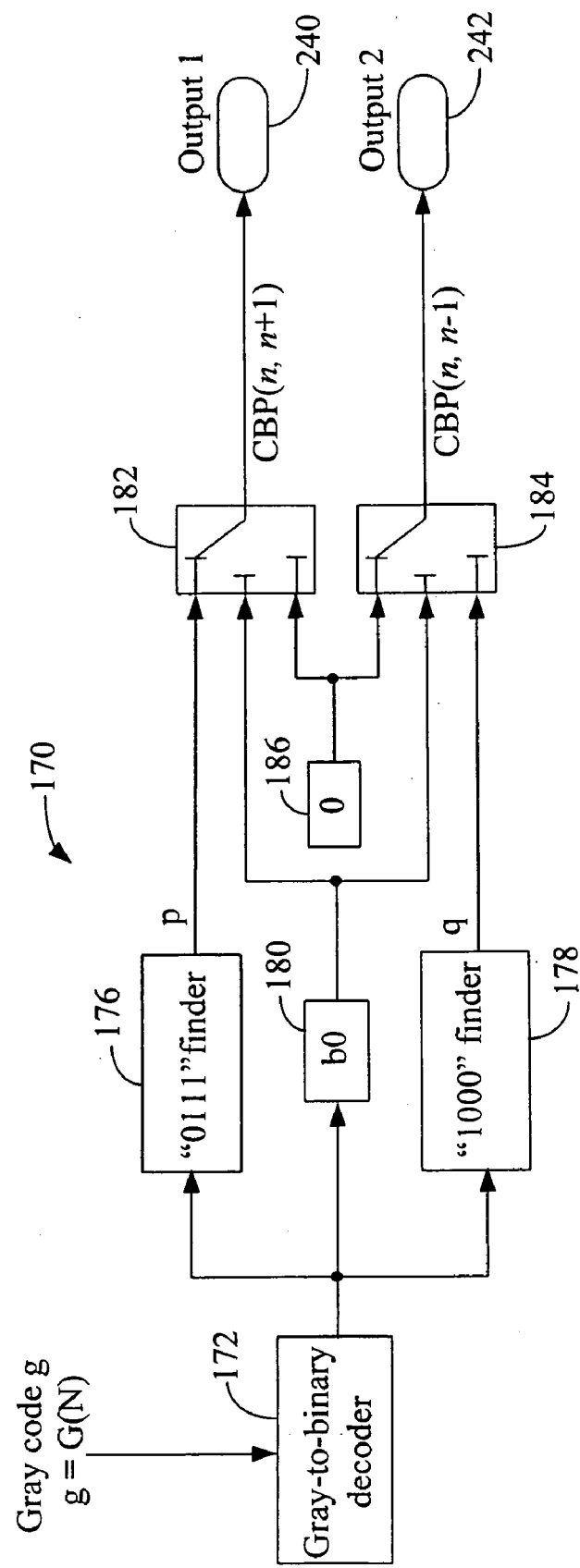

FIG. 7 shows an example of a key bit position detector 170 that finds the key bit positions of a Gray code g=G(n) based on the bit values of a corresponding binary number b in accordance with the second method. A Gray-to-binary decoder 172 receives the Gray code g and generates the corresponding binary number b according Equs. 3 and 4. The binary number b is output on a signal line 174. A "0111" pattern finder 176 evaluates the binary number b to determine whether a bit pattern "0111 . . ." can be found in the binary number b, and outputs a bit position p in which $b_p=0$, and $b_m=1$, for m=0 to p−1. The "0111" pattern finder 176 finds bit patterns "0", "01", "011", "0111", and so forth. A "1000" pattern finder 178 evaluates the binary number b to determine whether a pattern "1000 . . ." can be found in the binary number b, and outputs a bit position q in which $b_q=1$, and $b_m=0$, for m=0 to q−1. The "1000" pattern finder 178 finds bit patterns "1", "10", "100", "1000", and so forth.

The $0^{th}$ bit ($b_0$) of the binary number b is stored in a register 180 to control the multiplexers 182 and 184. The multiplexer 182 outputs a value that represents CBP(n, n+1), and the multiplexer 184 outputs a value that represents CBP(n, n−1). If $b_0=1$, the multiplexer 182 outputs the number p, and the multiplexer 184 outputs the number 0 (which is received from a register 186), meaning that CBP(n, n+1)=p, and CBP(n, n−1)=0. If $b_0=0$, the multiplexer 182 outputs the number 0, and the multiplexer 184 outputs the number q, meaning that CBP(n, n+1)=0, and CBP(n, n−1)=q.

Figure 8:
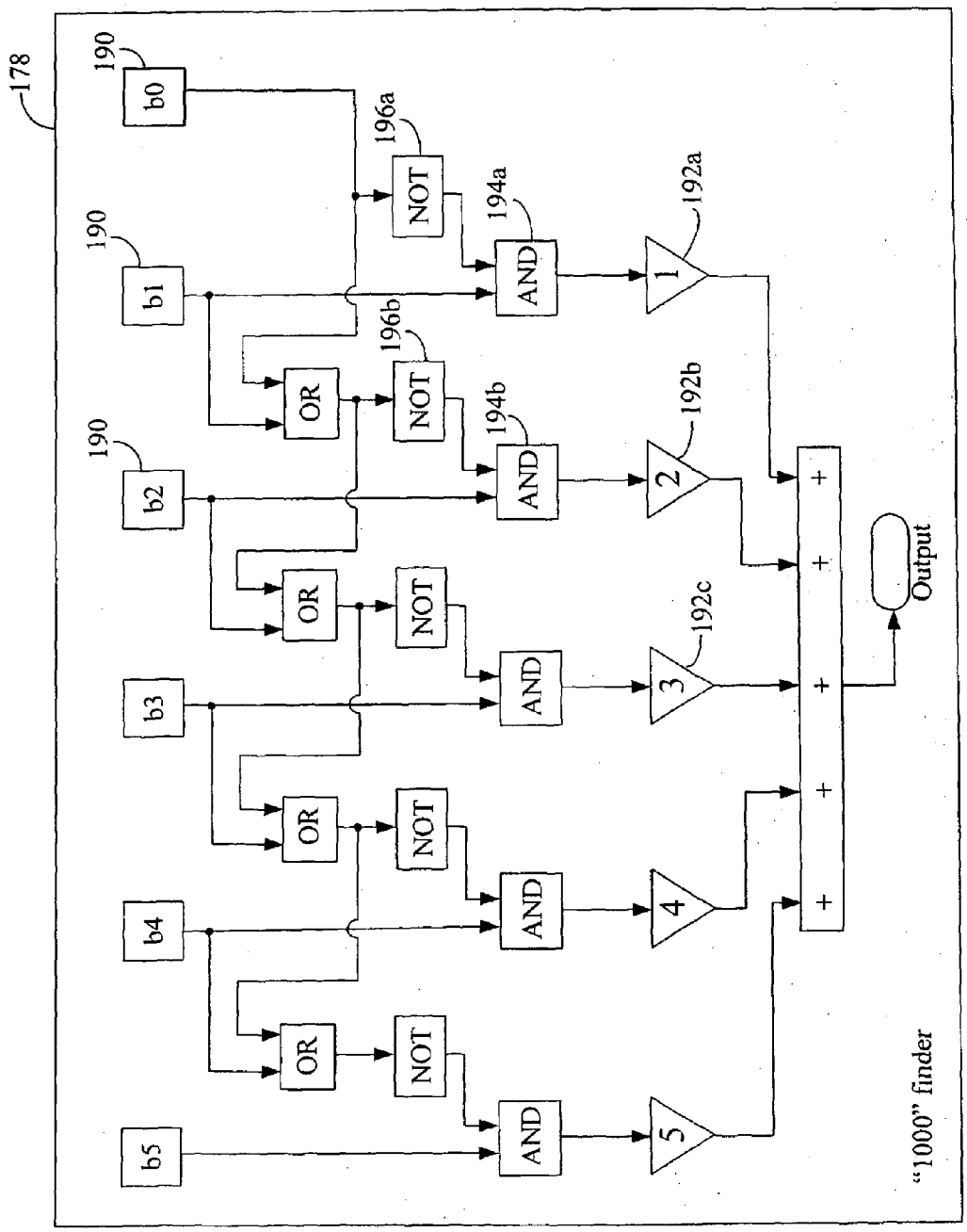
FIG. 8 shows a "1000" pattern finder.

FIG. 8 shows an example of a "1000" pattern finder 178 for finding a bit position q in a 6-digit Gray code g based on bit values of a corresponding binary number b, in which $b_q$ is equal to 1 and the bit positions lower than $b_q$ is (or are) 0. Registers 190 store the bit values of the binary number b.

A register 192a outputs a value 1 when an AND gate 194a outputs 1, which occurs when $b_1=1$ and a NOT gate 196a outputs 1, which in turn occurs when $b_0=0$. Thus, the register 192a outputs 1 when b has a pattern "xxxx10."

The second register 192b outputs a value 2 when an AND gate 194b outputs 1, which occurs when $b_2=1$ and the output of a NOT gate 196b is equal to 1, which in turn occurs when both $b_1$ and $b_0$ are equal to 0. Thus, the register 192b outputs 2 when b has a pattern "xxx100." Similarly, the register 192c outputs a value 3 when $b_3=1$ and $b_2=b_1=b_0=0$, and so forth. If $b_0=1$, the "1000" pattern finder 178 outputs 0.

Figure 9:
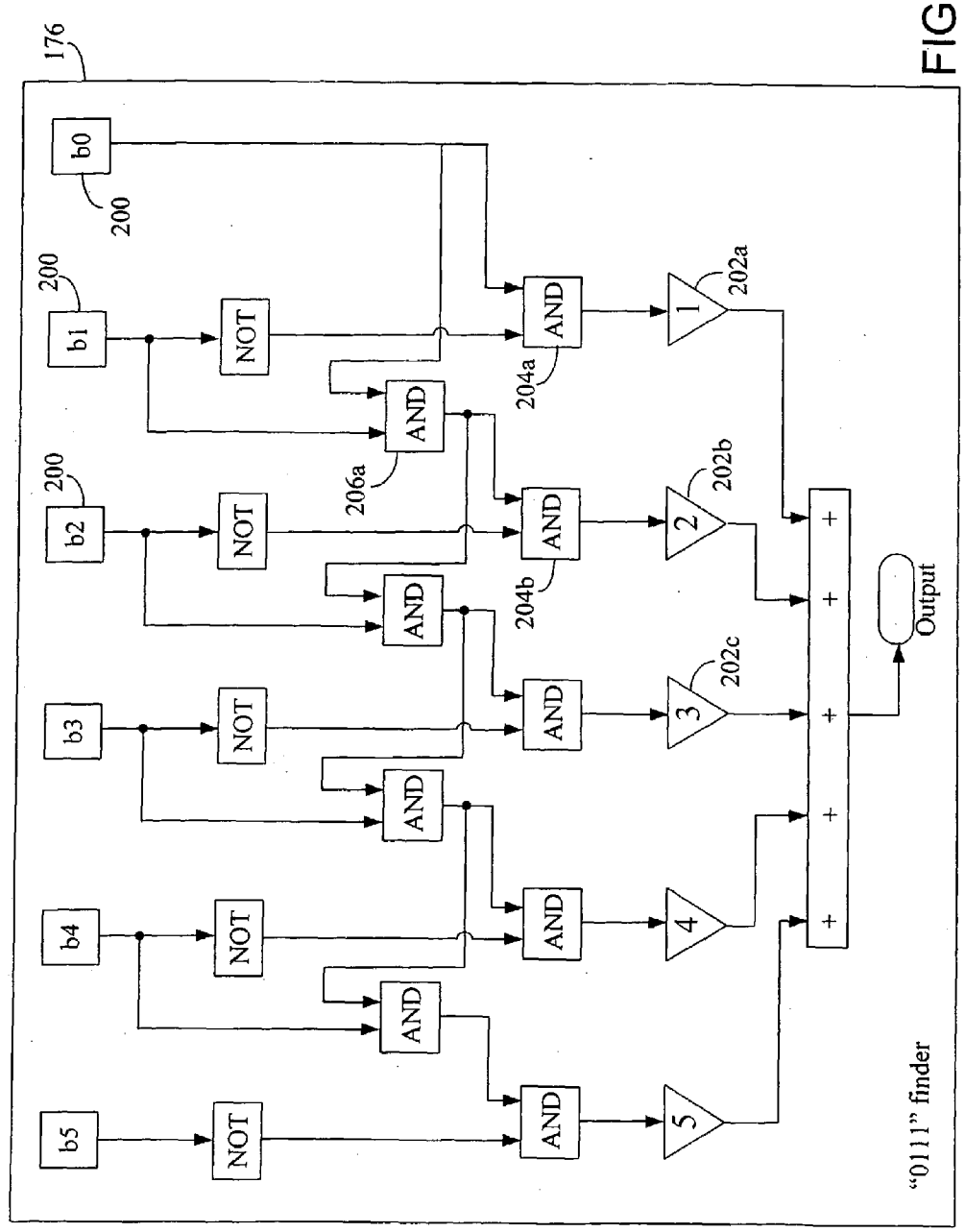
FIG. 9 shows a "0111" pattern finder.

FIG. 9 shows an example of a "0111" pattern finder 176 that finds a bit position p in a 6-digit Gray code g based on a corresponding binary number b, where $b_p$ is equal to 0, and the bit position(s) lower than $b_p$ is (or are) 1. Registers 200 store the bit values of the binary number b.

A register 202a outputs a value 1 when an AND gate 204a outputs 1, which occurs when $b_0=1$ and $b_1=0$. Thus, the register 202a outputs 1 when b has a pattern "xxxx01." A register 202b outputs a value 2 when an AND gate 204b outputs 1, which occurs when $b_2=0$ and the output of an AND gate 206a is equal to 1, which in turn occurs when both $b_1$ and $b_0$ are equal to 1. Thus, the register 202b outputs 2 when b has a pattern "xxx011." Similarly, a register 202c outputs a value 3 when $b_3=0$ and $b_2=b_1=b_0=1$, and so forth. If $b_0=0$, the "0111" pattern finder 176 outputs 0.

Figure 10:
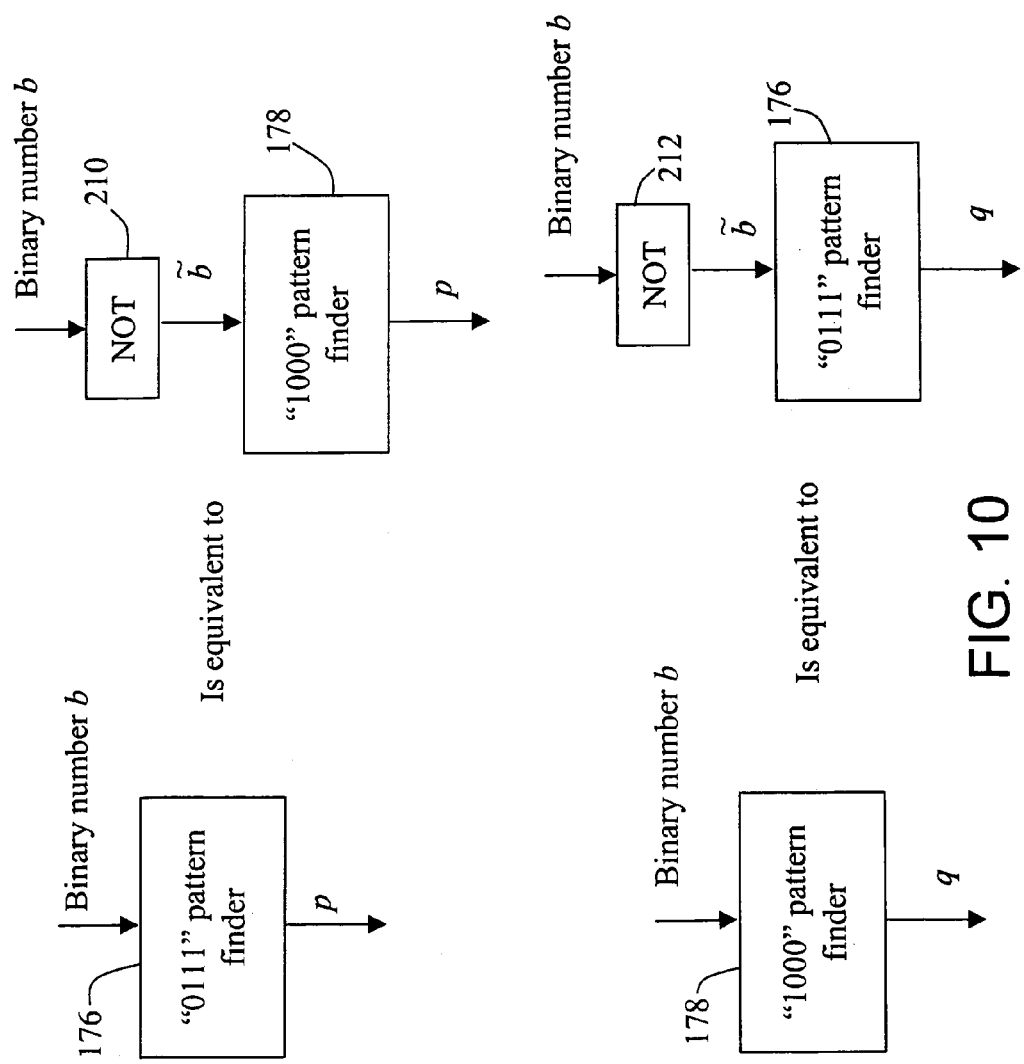
FIG. 10 shows equivalent pattern finders.

Referring to FIG. 10, the "0111" pattern finder 176 in FIG. 7 can be implemented by connecting a NOT gate 210 in series with the "1000" pattern finder 178. The NOT gate 210 inverts all of the bit values in the binary number b, thus finding a "0111 . . . " pattern in the original binary number b is the same as finding a "1000 . . . " pattern in the inverted binary number $\bar{b}$. Similarly, the "1000" pattern finder 178 in FIG. 7 can be implemented by connecting a NOT gate 212 in series with the "0111" pattern finder 176. The NOT gate 212 inverts all of the bit values in the binary code, thus finding a "1000 . . . " pattern in the original binary number b is the same as finding a "0111 . . . " pattern in the inverted binary number $\bar{b}$.

Figure 11:
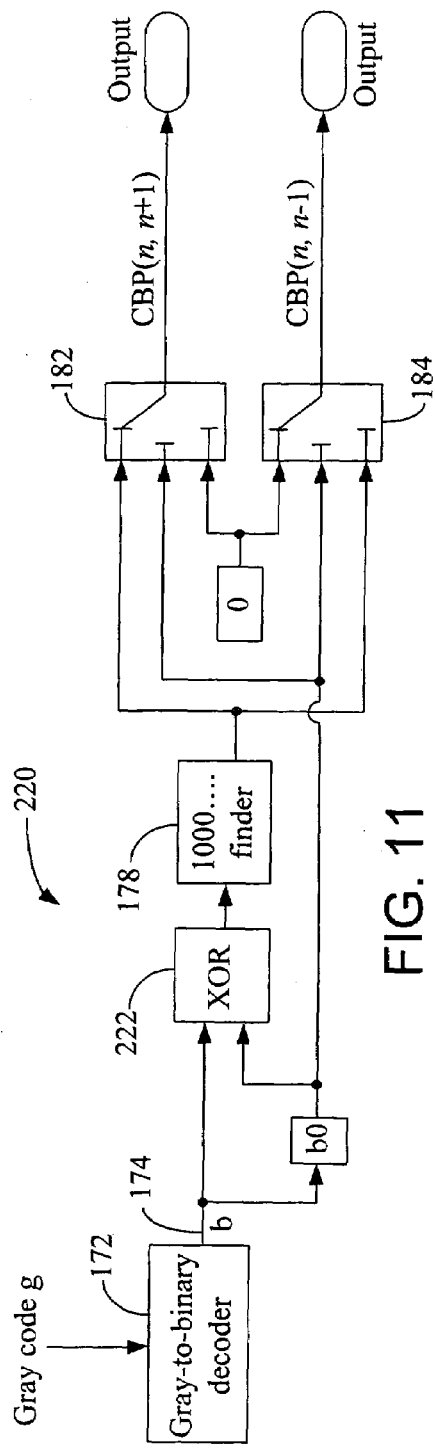

FIG. 11 shows an alternative example of a key bit positions detector 220 that finds the key bit positions of a Gray code g=G(n) based on the bit values of a corresponding binary number b. A Gray-to-binary decoder 172 receives a Gray code g and outputs a corresponding binary number b on a signal line 174. The binary number b and its least significant bit $b_0$ is sent to an XOR unit 222, which outputs the inverse of b if $b_0=1$, and outputs b if $b_0=0$.

If $b_0=1$, the XOR unit 222 inverts the binary number b, so that the combination of the XOR unit 222 and the "1000" pattern finder 178 is equivalent to the "0111" pattern finder 176. A multiplexer 182 outputs a bit position p as CBP(n, n+1), in which $b_p=0$ and $b_m=1$ for m=1 to p−1. A multiplexer 184 outputs 0 as CBP(n, n−1).

If $b_0=0$, the XOR unit 222 does not change the binary number b, so the "1000" pattern finder 178 still looks for a "1000 . . . " pattern. The multiplexer 182 outputs 0 as CBP(n, n+1), and the multiplexer 184 outputs a bit position q as CBP(n, n−1), in which $b_q=1$ and $b_m=0$, for m=1 to q−1.

Figure 12:
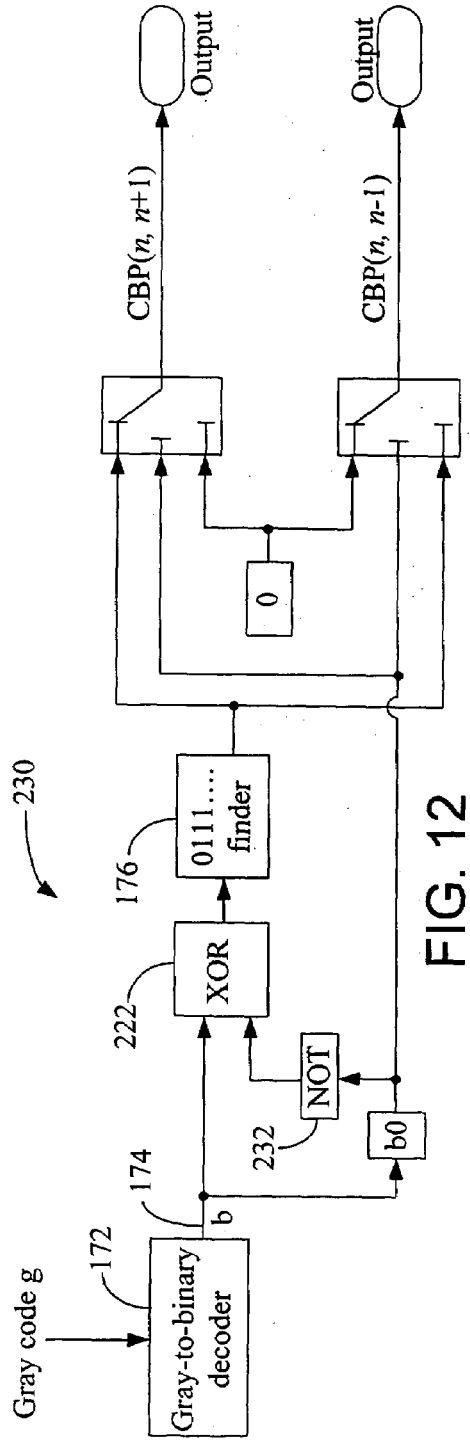

FIG. 12 shows another example of a key bit positions detector 230 that is similar to the key bit positions detector 220. A NOT unit 232 inverts the least significant bit $b_0$, so that an XOR unit 222 inverts the binary number b when $b_0=0$, and does not invert the binary number b when $b_0=1$. The detector 230 uses a "0111" pattern finder 176 instead of a "1000" pattern finder 178. The combination of the NOT unit 232, the XOR unit 222, and the "0111" pattern finder 176 has the same function as the combination of the XOR unit 222 and the "1000" pattern finder 178.

Figure 13:
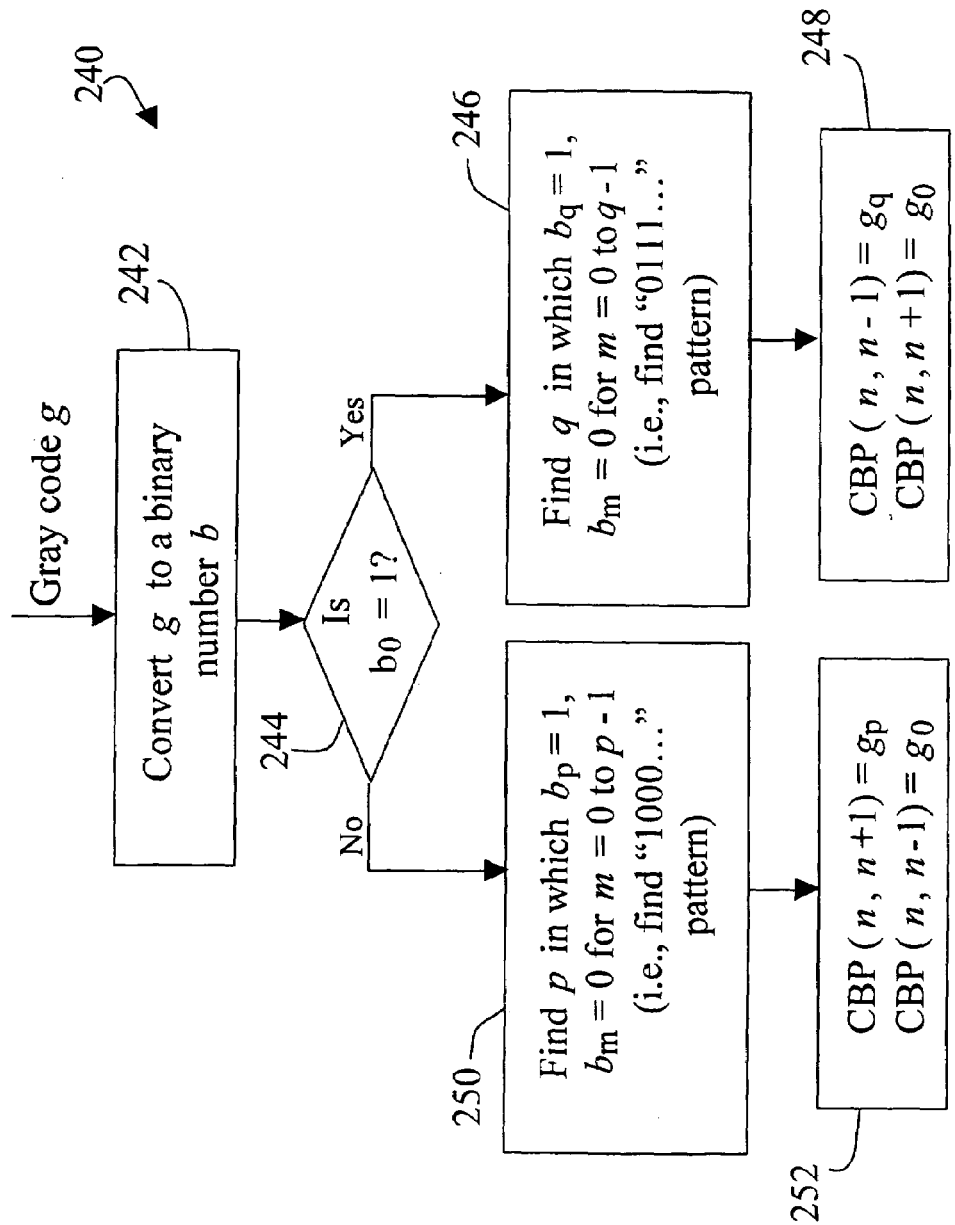

FIG. 13 shows a process 240 for finding the key bit positions of a Gray code g=G(n) based on the bit values of a corresponding binary number b. The Gray code g is received and converted (242) into a binary number b. The least significant bit $b_0$ is evaluated (244) to see if it is equal to 1. If $b_0=1$, the bit values of b are evaluated (246) to find the lowest bit position q in which $b_q=0$, and $b_m=1$ for m=0 to q−1. This finds the "0111 . . . " bit pattern, including bit patterns "0", "01", "011", "0111", and so forth. CBP(n, n−1) is assigned (248) to be $g_q$, and CBP(n, n+1) is assigned to be $g_0$. If $b_0=0$, the bit values of b are evaluated (250) to find the lowest bit position p in which $b_p=1$, and $b_m=0$ for m=0 to p−1. This finds the "1000 . . . " bit pattern, including bit patterns "1", "10", "100", "1000", and so forth. CBP(n, n+1) is assigned (252) to be $g_p$, and CBP(n, n−1) is assigned to be $g_0$.

FIG. 14 shows an example of a software subroutine 260 for finding the bit pattern "100 . . . " in a 12-digit binary number b. The variable CBP represents the key bit position. The bit values of the binary number b is stored in an array.

The $0^{th}$ bit value is b[0], the $1^{st}$ bit value is b[1], and so forth. In the for-loop, each bit position of the binary value b is evaluated, if a bit position m is found such that b[m]=1, then m is the lowest bit position having a bit value 1. The number m is assigned to be the key bit position, and the subroutine exits.

FIG. 15 shows an example of a software subroutine 270 for finding the bit pattern "0111 . . . " in a 12-digit binary number b. The variable CBP represents the key bit position. The bit values of the binary number b is stored in an array. The $0^{th}$ bit value is b[0], the $1^{st}$ bit value is b[1], and so forth. In the for-loop, each bit position of the binary value b is evaluated, if a bit position m is found such that b[m]=0, then m is the lowest bit position having a bit value 0. The number m is assigned to be the key bit position, and the subroutine exits.

FIG. 16 shows an example of a software subroutine 274 for finding the bit pattern "0111 . . . " or "1000 . . . " in a 12-digit binary number b. The variable CBP represents the key bit position. The bit values of the binary number b is stored in an array. The $0^{th}$ bit value is b[0], the $1^{st}$ bit value is b[1], and so forth. In the for-loop, each bit position of the binary value b is evaluated, if a bit position m is found such that b[m]!=b[0]), then m is the lowest bit position having a bit value that is different from b[0]. The number m is assigned to be the key bit position, and the subroutine exits.

As an example, the bit positions can be sequentially tested from the $1^{st}$ bit position to higher bit positions, or from the highest bit position to lower bit positions, using the third method described above until a key bit position is found.

FIG. 17 shows a subroutine 280 to find the key bit position m of a 12-digit Gray code. The subroutine 280 sequentially tests whether the $m^{th}$ bit position, m=0 to 11, is a key bit position by setting $g_m$ to 0 or 1, decoding the corresponding binary numbers, and testing whether their difference is equal to 1. If the difference is equal to 1, then m is a key bit position. If the difference is not equal to 1, then the bit value of $g_m$ is restored, and the next bit position is tested.

Verifying Whether a Bit Position is a Key Bit Position

The earlier described methods determine, from a given Gray code, which are the key bit positions. It is also possible to verify whether a given bit position of a Gray code is a key bit position.

The following describes a method for determining whether a given bit position m of a Gray code $g=(g_{i-1}, \ldots, g_2, g_1, g_0)$ is a key bit position. This involves altering the bit value at the given bit position m and deciding whether the corresponding binary number changes by one. Initially, set $g_m=1$, and decode g to generate a binary number B_1. Then set $g_m=0$, and decode g to generate a second binary number B_0. If |B_1−B_0|=1, then the $m^{th}$ bit position is a key bit position.

As an example, to determine whether the $5^{th}$ bit position of the Gray code g=0011,0111,1000 is a key bit position, the $5^{th}$ bit of g is first set to 1, and a first binary number B_1 is decoded from the Gray code, in which B_1=0010, $0101,0000_{(2)}=592_{(10)}$. The $5^{th}$ bit is then set to 0, and a second binary number B_0 is decoded from the Gray code, in which B_0=0010,0110, $1111_{(2)}=623_{(10)}$. Because the difference between B_1 and B_0 is not 1, the $5^{th}$ bit position is not a key bit position.

To determine whether the $4^{th}$ bit position of the Gray code g=0011,0111,1000 is a key bit position, the $4^{th}$ bit of g is set to 1, and a first binary number B_1 is decoded from the Gray code, in which B_1=0010,0101, $0000_{(2)}=592_{(10)}$. Then the $4^{th}$ bit of g is then set to 0, and a second binary number B_0 is decoded from the Gray code, in which B_0=0010,0100, $1111_{(2)}=591_{(10)}$. Because the difference between B_1 and B_0 is 1, the $4^{th}$ bit position is a key bit position.

Figure 18:
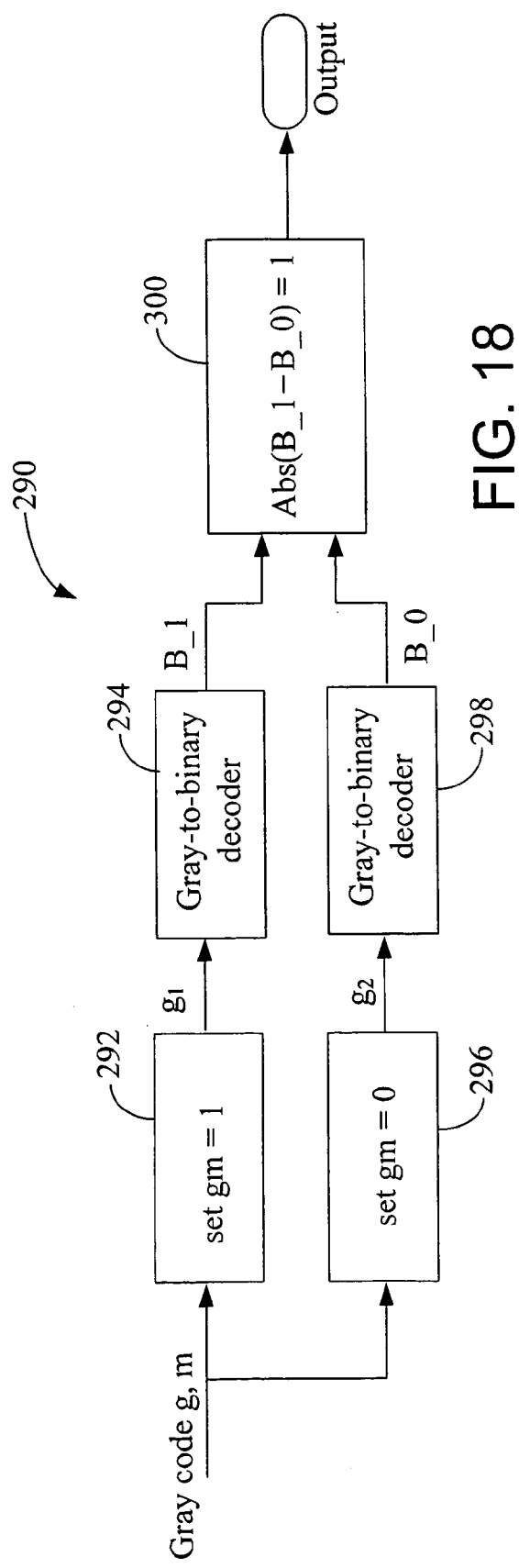
FIG. 18 shows a circuit to determine whether a particular bit position of a Gray code is a key bit position.

FIG. 18 shows a block diagram of a circuit 290 to determine whether a particular bit position m of a Gray code g is a key bit position. The Gray code g and the bit position m are sent to a unit 292 in which the bit value of g at bit position m is set to 1, resulting in a Gray code $g_1=(g_{i-1}, \ldots g_{m+1}, 1, g_{m-1}, \ldots g_0)$. The Gray code $g_1$ is a Gray-to-binary decoder 294 to generate a binary number B_1. The Gray code g and the bit position m are also sent to a unit 296 in which the bit value of g at bit position m is set to 0, resulting in a gray code $g_2=(g_{i-1}, \ldots g_{m+1}, 0, g_{m-1}, \ldots g_0)$. The Gray code $g_2$ is sent to a Gray-to-binary decoder 298 to generate a binary number B_0. A unit 300 outputs a difference between B_1 and B_0. If the difference is 1, the bit position m is a key bit position. If the difference is not 1, the bit position m is not a key bit position.

The circuits and processes for determining and verifying key bit positions in a Gray code are useful in an optical recording system in which the track numbers of an optical disc are expressed as Gray codes.

Figure 19:
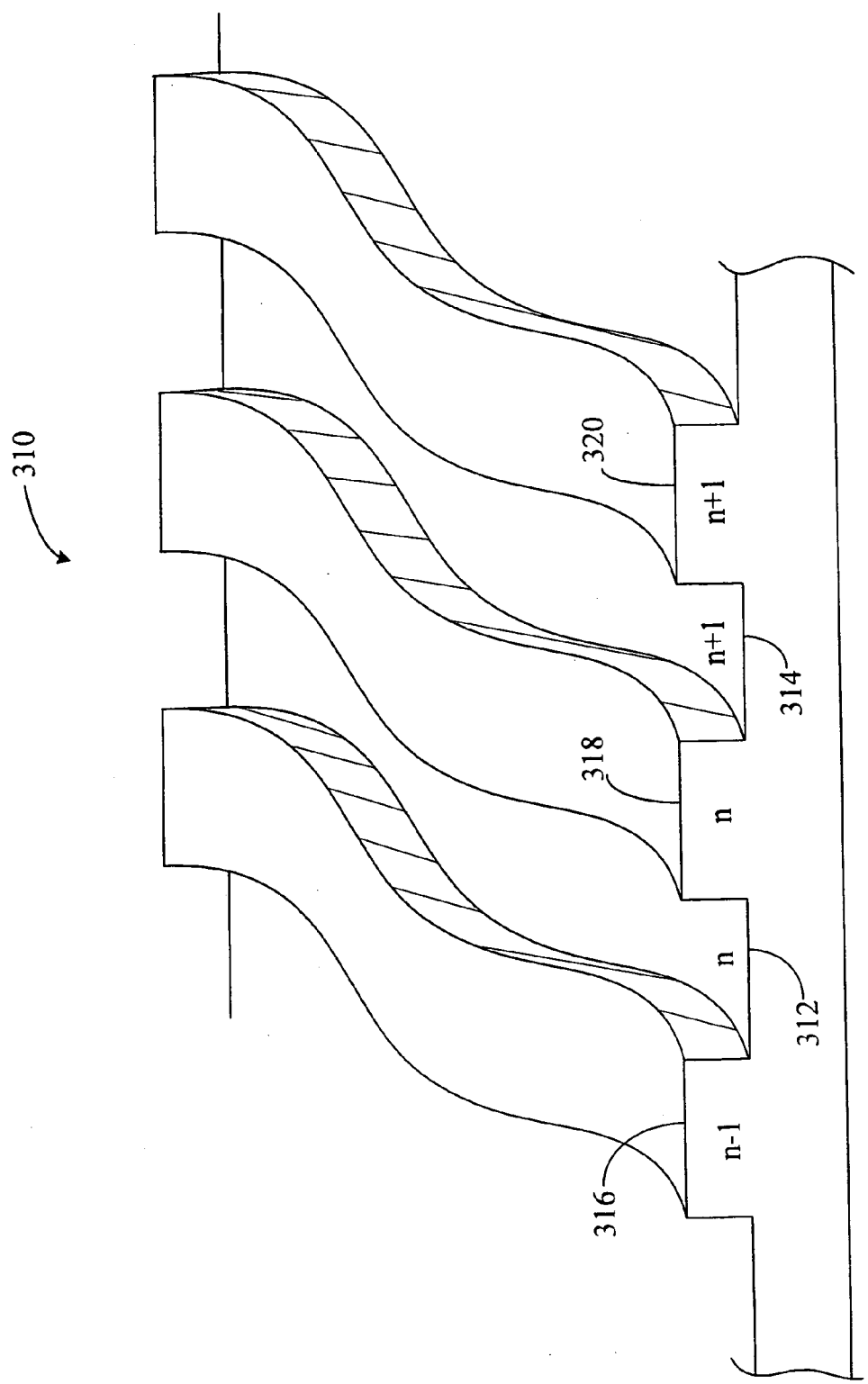
FIG. 19 shows groove and land tracks.

FIG. 19 shows an example of an optical disc 310 that has groove tracks (e.g., 312 and 314) and land tracks (e.g., 316, 318, and 320). The groove tracks 312 and 314 are different portions of a single spiral groove track. The land tracks 316, 318, and 320 are different portions of a single spiral land track. The groove track has recurring variations in the radial position of the track, referred to as track wobble. The track wobble has a substantially sinusoidal pattern that is modulated according to address codes and track codes. The address codes provide information on the current position relative to a beginning of a track. The track codes provide information on track numbers.

In one example, the track codes are Gray codes that correspond to the track numbers. The groove track numbers sequentially increase from an inner track (e.g., track number 1) to an outer track (e.g., track number n). In between the groove tracks are the land tracks. The land tracks also store track codes that provide information about land track numbers. For example, the groove tracks 312 and 314 have track numbers n and n+1, respectively, and the land tracks 316, 318, and 320 have track numbers n−1, n, and n+1, respectively.

When an optical recording system reads a track number from the track wobble, due to the small dimension of the tracks, an error may occur during the decoding process. The error may be detected using, e.g., a parity bit or a checksum value. When there is an error in the track number, there are a number of ways to recover the correct track number. In some of the recovery methods, it may be useful to know which bit positions in the Gray code (that represent the track number) are the key bit positions. Having knowledge about the key bit positions may reduce the amount of time that is required to correct the errors in the track number information.

Although some examples have been discussed above, other implementation and applications are also within the scope of the following claims. For example, in the process 100 of FIG. 3, for applications that do not need to know whether a change in the bit value at the key bit position will result in an increase or decrease in the corresponding binary number, determining (106) whether the Gray code has an odd parity can be omitted, and the process outputs 0 and m+1 as the key bit positions. The finder module 136 in FIG.

5, "1000" pattern finder 178 in FIG. 8, and "0111" pattern finder 176 in FIG. 9, can be different from what was described.

In FIG. 5, for applications that only need to find the key bit position m in which a change in bit value at the $m^{th}$ bit position results in an increase in the corresponding binary number, then the multiplexer 148 and a NOT unit 145 can be omitted, and only output 132 is used. Similarly, for applications that only need to find the key bit position m in which a change in bit value at the $m^{th}$ bit position results in a decrease in the corresponding binary number, then the multiplexer 146 can be omitted, and only output 134 is used.

In FIG. 9, the "0111" pattern finder 176 can be designed so that if the "0111 . . . " pattern is not found, finder 176 outputs 0. Similarly, the "1000" pattern finder 178 can be designed so that if the "1000 . . . " pattern is not found, finder 178 outputs 0. Thus, in FIG. 7, the registers 180 and 186, and multiplexers 182 and 184 can be omitted.

Different types of Gray codes can be used. For example, FIG. 20 shows an example of a sequence of Gray codes 330 that maps to a sequence of binary numbers 0000 to 1111. Similar to the sequence of Gray codes in FIG. 1, in FIG. 20, adjacent binary numbers n and n+1 (or n and n−1) are represented by Gray codes that differ by a single digit. When the Gray codes 330 are used, the key bit position of a Gray code is determined from the bit values of the Gray code (method 1), or bit values of the binary number corresponding to the Gray code (method 2). When method 1 is used, the key bit position is determined by finding the lowest bit position k in the Gray code that has a bit value 0. The (k+1)-th bit position will be a key bit position. If $g_m$ is the lowest bit position that has a bit value 0, and the 0th bit of the corresponding binary number has a bit value 1, then CBP(n, n−1)=$g_0$ and CBP(n, n+1)=$g_{m+1}$. If $g_m$ is the lowest bit position that has a bit value 0, and the $0^{th}$ bit of the corresponding binary number (i.e., $b_0$) has a bit value 0, then CBP(n, n+1)=$g_0$, and CBP(n, n−1)=$g_{m+1}$.

What is claimed is:

1. A method of finding a key bit position in a Gray code, the key bit position defined such that changing a bit value at the key bit position of the Gray code results in an increase or decrease of a corresponding binary number by one, the method comprising:
    receiving, at a device, any Gray code of a group of Gray codes, the Gray code having more than four bits;
    deriving, using the device, a binary number from the Gray code based on a predetermined mapping;
    finding, using the device, a particular bit position in the binary number so that no bit values at bit positions lower than the particular bit position are the same as the bit value of the particular bit position; and
    assigning the particular bit position as the key bit position.

2. The method of claim 1 in which deriving the binary number from the Gray code comprises exclusive-OR operations.

3. The method of claim 2, wherein the Gray code and the binary number both have i+1 digits, and deriving the binary number from the Gray code comprises using equations: $b_i = g_i$ and $b_m = g_m \oplus b_m$ or $b_m = g_m \oplus g_{m+1} \oplus \ldots \oplus g_i$, for m=0, 1, 2, . . . , i−1, wherein the Gray code has bit values $g_i, g_{i-1}, g_{i-2}, \ldots, g_2, g_1$, and $g_0$, and the binary number has bit values $b_i, b_{i-1}, b_{i-2}, \ldots, b_2, b_1$, and $b_0$.

4. The method of claim 1 in which the binary number has bit values $b_i, b_{i-1}, b_{i-2}, \ldots, b_2, b_1$, and $b_0$, and finding the particular bit position comprises finding p-th bit position in the binary number so that bit values $(b_p, b_{p-1}, b_{p-2}, \ldots, b_1, b_0)$ are (0, 1, 1, . . . , 1, 1).

5. The method of claim 1 in which the binary number has bit values $b_i, b_{i-1}, b_{i-2}, \ldots, b_2, b_1$, and $b_0$, and finding the bit position comprises finding a p-th bit position in the binary number so that bit values $(b_p, b_{p-1}, b_{p-2}, \ldots, b_1, b_0)$ are (1, 0, 0, . . . , 0, 0).

6. The method of claim 1 in which the binary number has bit values $b_i, b_{i-1}, b_{i-2}, \ldots, b_2, b_1$, and $b_0$, the method further comprising using registers in which a p-th register associated with $b_p$ outputs a value p when bit values $(b_p, b_{p-1}, b_{p-2}, \ldots, b_1, b_0)$ are (0, 1, 1, . . . , 1, 1), p being an integer, $1 \leq p \leq i$.

7. The method of claim 1 in which the binary number has bit values $b_i, b_{i-1}, b_{i-2}, \ldots, b_2, b_1$, and $b_0$, the method further comprising using registers in which a p-th register associated with $b_p$ outputs a value p when bit values $(b_p, b_{p-1}, b_{p-2}, \ldots, b_1, b_0)$ are (1, 0, 0, . . . , 0, 0), p being an integer, $1 \leq p \leq i$.

8. The method of claim 1 wherein finding, using the device, a particular bit position in the binary number comprises performing an XOR operation on the binary number and the least significant bit of the binary number.

9. A method of determining a key bit position in a Gray code, the Gray code being a member of a series of Gray codes, each Gray code being different from an adjacent Gray code in the series at a key bit position, comprising:
    deriving a binary number from a first Gray code based on a predetermined mapping;
    evaluating bit values at different bit positions of the binary number to find a predetermined pattern in the bit values of the binary number to determine one of two key bit positions of the first Gray code without deriving a second binary number; and
    outputting a value that represents the key bit position.

10. The method of claim 9 wherein the predefined pattern comprises bit values $(b_p, b_{p-1}, b_{p-2}, \ldots, b_1, b_0)$=(1, 0, 0, . . . , 0, 0), in which the binary number has bit values $b_i, b_{i-1}, b_{i-2}, \ldots, b_2, b_1$, and $b_0$, $1 \leq p \leq i$.

11. A method of identifying a key bit position, the method comprising:
    accepting any first Gray code representation of a number n in a range of numbers;
    based on knowledge of the first Gray code representation alone, without conversion to a binary representation of n, finding a predetermined pattern in the bit values of the first Gray code representation to identify a bit position such that a second Gray code representation of n+1 or n−1 differs from the first Gray code representation only in that bit position; and
    outputting a value that represents the bit position.

12. The method of claim 11 in which the bit position is identified without reference to stored Gray code representations other than the first Gray code.

13. The method of claim 11 in which the bit position is identified without requiring conversion to a binary representation of n.

14. The method of claim 13 in which the bit position is identified without incrementing or decrementing the binary representation of n.

15. A method of determining a key bit position in a Gray code, the Gray code being a member of a group of Gray codes that are associated with a group of binary numbers, each Gray code having more than two bits, each Gray code corresponding to a binary number, and for any two Gray codes that differ only in a key bit position, two corresponding binary numbers differ by one, the method comprising:
    receiving a Gray code in the group of Gray codes, and identifying at least one of two key bit positions of the received Gray code by finding a predetermined pattern of bit values in the received Gray code without comparing the received Gray code to other Gray codes in the group after receiving the Gray code; and outputting at least one value that represents the at least one of two key bit positions.

16. The method of claim 15, wherein the received Gray code has k bits, the (k−1)-th bit position being the highest bit position and the 0-th bit being the lowest bit position, and wherein identifying at least one of the two key bit positions of the received Gray code comprises finding an m-th bit position of the received Gray code, so that a bit value at the m-th bit position is equal to 1 and the bit values at all lower bit positions are equal to 0.

17. The method of claim 16 in which identifying at least one of the two key bit positions of the received Gray code comprises identifying the (m+1)-th bit position as the key bit position of the Gray code.

18. The method of claim 15, further comprising changing a bit value at the identified key bit position of the received Gray code to generate a second Gray code.

19. The method of claim 15 in which identifying at least one of the two key bit positions comprises identifying a key bit position without determining a binary number that is associated with the received Gray code.

20. The method of claim 15, further comprising determining whether changing the bit value at the key bit position of the received Gray code to generate a second Gray code will result in an increase or decrease of the corresponding binary number by 1, the determination being performed without actually deriving the binary corresponding number.

21. The method of claim 20 in which determining whether the second Gray code will result in an increase or decrease of the corresponding binary number comprises examining whether the least significant bit of the received Gray code has a bit value of 1 or 0.

22. A method comprising:
receiving a first Gray code;
based on knowledge that the first Gray code differs from a second Gray code only in a key bit position, and that the first and second Gray codes correspond to two associated numbers that differ by one, but without knowledge of all the bit values of the second Gray code,
finding a predetermined pattern in the bit values of the first Gray code to identify one of two key bit positions of the first Gray code; and
deriving the second Gray code by changing the bit value at the identified key bit position of the first Gray code.

23. The method of claim 22 wherein identify one of two key bit positions of the first Gray code comprises finding a k-th bit position in the first Gray code that has a bit value 1 and all lower bit positions having bit values 0, and identifying the (k+1)-th bit position as the key bit position.

24. An apparatus for detennining a key bit position in a Gray code, the Gray code being a member of a group of Gray codes that represent a group of binary numbers, each Gray code having more than two bits, and for any two binary numbers that differ by one, two corresponding Gray codes differ only in a key bit position, the apparatus comprising:
an input to receive any Gray code of a group of Gray codes;
a logic circuit to evaluate bit values at different bit positions of the received Gray code and find a predetermined relationship among the bit values to determine at least one of a first key bit position and a second key bit position of the received Gray code without using bit values of other Gray codes; and
at least one of
a first output to output a first value representing the first key bit position such that when the received Gray code changes its bit value at the first key bit position, a corresponding binary number increases by one, and
a second output to output a second value representing the second key bit position such that when the received Gray code changes its bit value at the second key bit position, a corresponding binary number decreases by one.

25. The apparatus of claim 24 wherein the Gray code has bit values $g_i, g_{i-1}, g_{i-2}, \ldots, g_2, g_1$, and $g_0$, and the logic circuit comprises registers, a p-th register associated with $g_p$ and outputting a value p+1 when bit values $(g_p, g_{p-1}, g_{p-2}, \ldots, g_1, g_0)$ are $(1, 0, 0, \ldots, 0, 0)$, p being an integer, $1 \leq p \leq i-1$.

26. The apparatus of claim 24 wherein each Gray code and its corresponding binary number both have i+1 digits, and the corresponding binary number can be derived from the Gray code using equations: $b_i = g_i$ and $b_m = g_m \oplus b_{m+1}$ or $b_m = g_m \oplus g_{m+1} \oplus \ldots \oplus g_i$, for m=0, 1, 2, ..., i−1, wherein the Gray code has bit values $g_i, g_{i-1}, g_{i-2}, \ldots, g_2, g_1$, and $g_0$, and the binary number has bit values $b_i, b_{i-1}, b_{i-2}, \ldots, b_2, b_1$, and $b_0$.

27. The apparatus of claim 24, further comprising a Gray code generator to generate a second Gray code by changing a bit value at the key bit position of the received Gray code.

28. The apparatus of claim 24, further comprising a parity generator to detennine whether the Gray code has even parity or odd parity.

29. The apparatus of claim 28, further comprising a multiplexer that selects the least significant bit position as the first key bit position when the Gray code has even parity.

30. The apparatus of claim 28, further comprising a multiplexer that selects the least significant bit position as the second key bit position when the Gray code has odd parity.

31. An apparatus for determining a key bit position in a Gray code, the Gray code being a member of a group of Gray codes that represent a group of binary numbers, each Gray code having more than two bits, and for any two binary numbers that differ by one, two corresponding Gray codes differ only in a key bit position, the apparatus comprising:
an input to receive any Gray code of a group of Gray codes;
a Gray-to-binary decoder to derive a binary number from the received Gray code;
a logic circuit to evaluate bit values at different bit positions of the binary number to find a predetermined relationship among the bit values to determine at least one of a first key bit position and a second key bit position of the received Gray code without using bit values of other binary numbers; and
at least one of
a first output to output the first key bit position such that when the received Gray code changes its bit value at the first key bit position, a corresponding binary number increases by one, and
a second output to output the second key bit position such that when the received Gray code changes its bit value at the second key bit position, a corresponding binary number decreases by one.

32. The apparatus of claim 31 wherein the binary number has bit values $b_i, b_{i-1}, b_{i-2}, \ldots, b_2, b_1$, and $b_0$, and the logic circuit comprises registers, the p-th register associated with $b_p$ and outputting a value p when bit values ($b_p$, $b_{p-1}$, $b_{p-2}$, ..., $b_1$, $b_0$) are (1, 0, 0, ..., 0, 0), p being an integer, $1 \leq p \leq i$.

33. The apparatus of claim 31 wherein the binary number has bit values $b_i$, $b_{i-1}$, $b_{i-2}$, ..., $b_2$, $b_1$, and $b_0$, and the logic circuit comprises registers, the p-th register associated with $b_p$ and outputting a value p when bit values ($b_p$, $b_{p-1}$, $b_{p-2}$, ..., $b_1$, $b_0$) are (0, 1, 1, ..., 1, 1), p being an integer, $1 \leq p \leq i$.

34. The apparatus of claim 31 wherein the binary number has bit values $b_i$, $b_{i-1}$, $b_{i-2}$, ..., $b_2$, $b_1$, and $b_0$, and the logic circuit comprises a first sub-module and a second sub-module,
   the first sub-module comprising registers, a p-th register associated with $b_p$ and outputting a value p when bit values ($b_p$, $b_{p-1}$, $b_{p-2}$, ..., $b_1$, $b_0$) are (1, 0, 0, ..., 0, 0), p being an integer, $1 \leq p \leq i$,
   the second sub-module comprising registers, a p-th register associated with $b_p$ and outputtng a value p when bit vaues ($b_p$, $b_{p-1}$, $b_{-2}$, ..., $b_1$, $b_0$) are (0, 1, 1, ..., 1, 1), p being an integer, $1 \leq p \leq i$.

35. The apparatus of claim 34, further comprising a multiplexer to select the p-th bit position as the first key bit position when the least significant bit of the binary number is equal to 1.

36. The apparatus of claim 34, further comprising a multiplexer to select the p-th bit position as the second key bit position when the least significant bit of the binary number is equal to 0.

37. The apparatus of claim 31, further comprising a multiplexer to select the least significant bit position as the second key bit position when the least significant bit of the binary number is equal to 1.

38. The apparatus of claim 31, further comprising a multiplexer to select the least significant bit position as the first key bit position when the least significant bit of the binary number is equai to 0.

39. The apparatus of claim 31 wherein the logic circuit comprises an XOR gate that performs an XOR operation on the binary number and the least significant bit of the binary number.

40. The apparatus of claim 31, further comprising a Gray code generator to generate a second Gray code by changing a bit value at the key bit position of the received Gray code.

41. An apparatus for determining a key bit position in a Gray code, the Gray code being a member of a group of Gray codes that represent a group of binary numbers, each Gray code having more than two bits, and for any two binary numbers that differ by one, two corresponding Gray codes differ only in a key bit position, the apparatus comprising:
   an input to receive any Gray code of a group of Gray codes; and
   a logic circuit to evaluate bit values at different bit positions of the received Gray code to find a predetermined pattern in the bit values of the received Gray code to determine at least one of two key bit positions of the received Gray code.

42. The apparatus of claim 41 wherein the predefined pattern comprises bit values ($g_p$, $g_{p-1}$, $g_{p-2}$, ..., $g_1$, $g_0$)=(1, 0, 0, ..., 0, 0), in which the received Gray code has bit values $g_i$, $g_{i-1}$, $g_{i-2}$, ..., $g_2$, $g_1$, and $g_0$, and $1 \leq p \leq i-1$.

43. An apparatus for determining a key bit position in a Gray code, the Gray code being a member of a group of Gray codes that represent a group of binary numbers, each Gray code having more than two bits, and for any two binary numbers that differ by one, two corresponding Gray codes differ only in a key bit position, the apparatus comprising:
   an input to receive any Gray code of a group of Gray codes;
   a Gray-to-binary decoder to derive a binary number from the received Gray code; and
   a logic circuit to evaluate bit values at different bit positions of the binary number to find a predetermined pattern in the bit values of the binary number to determine at least one of two key bit positions of the received Gray code.

44. The apparatus of claim 43 wherein the predefined pattern comprises bit values ($b_p$, $b_{p-1}$, $b_{p-2}$, ..., $b_1$, $b_0$)=(1, 0, 0, ..., 0, 0), in which the binary number has bit values $b_i$, $b_{i-1}$, $b_{i-2}$, ..., $b_2$, $b_1$, and $b_0$, $1 \leq p \leq i$.

45. The apparatus of claim 43 wherein the predefined pattern comprises bit values ($b_i$, $b_{i-1}$, $b_{i-2}$, ..., $b_1$, $b_0$)=(0, 1, 1, ..., 1, 1), in which the binary number has bit values $b_i$, $b_{i-1}$, $b_{i-2}$, ..., $b_2$, $b_1$, and $b_0$, $1 \leq p \leq i$.

46. A method for determining a key bit position in a Gray code, the Gray code being a member of a group of Gray codes that represent a group of binary numbers, each Gray code having more than two bits, and for any two binary numbers that differ by one, two corresponding Gray codes differ only in a key bit position, the method comprising:
   accepting any Gray code of a group of Gray codes;
   evaluating bit values and bit positions of the accepted Gray code to find a predetermined relationship among the bit values to determine at least one of a first key bit position and a second key bit position of the received Gray code without using bit values of other Gray codes;
   outputting at least one of
      a first value representing a first key bit position such that when the received Gray code changes its bit value at the first key bit position, a corresponding binary number increases by one, and
      a second value representing a second key bit position such that when the received Gray code changes its bit value at the second key bit position, a corresponding binary number decreases by one.

47. The method of claim 46 further comprising determining whether the received Gray code has an even parity or odd parity. Gray code has an even parity or odd parity.

48. The method of claim 47first key bit position and a second key bit position is based on knowledge of whether the received Gray code has an even parity or odd parity.

49. The method of claim 47 wherein the Gray code has bit values $g_i$, $g_{i-1}$, $g_{i=2}$, ..., $g_2$, $g_1$, and $g_0$, and outputting the first value comprises outputting a value p+1 when the received Gray code has odd parity and bit values ($g_p$, $g_{p-1}$, $g_{-2}$, ..., $g_1 i$, $g_0$) are (1, 0, 0, ..., 0, 0), p being an integer, $1 \leq p \leq i-1$.

50. The method of claim 47 wherein the Gray code has bit values $g_i$, $g_{i-1}$, $g_{i-2}$, ..., $g_2$, $g_1$, and $g_0$, and outputting the second value comprises outputting a value p+1 when the received Gray code has even parity and bit values ($g_p$, $g_{p-1}$, $g_{p-2}$, ..., $g_1$, $g_0$) are (1, 0, 0, ..., 0, 0), p being an integer, $1 \leq i-1$.

51. A method comprising:
   detecting an error in a first Gray code;
   receiving a second Gray code that is known to differ from the first Gray code only in a key bit position, the first and second Gray codes corresponding to two associated numbers that differ by one;

determining one of two key bit positions of the second Gray code by finding a predetermined relationship among bit values of the second Gray code; and deriving a correct version of the first Gray code by changing the bit value at the key bit position of the second Gray code.

52. The method of claim 51 wherein determining one of two key bit positions of the second Gray code comprises finding a k-th bit position in the second Gray code that has a bit value 1 and all lower bit positions having bit values 0, and determining the (k+1)-th bit position as the key bit position.

53. The method of claim 51 wherein the first and second Gray codes belong to a Gray code system in which each Gray code and its associate number both have i+1 digits, and the associated number can be derived from the Gray code using equations: $b_i = g_i$ and $b_m = g_m \oplus b_{m+1}$ or $b_m = g_m \oplus g_{m+1} \oplus \ldots \oplus g_i$, for m=0, 1, 2, ..., i−1, in which the Gray code has bit values $g_i, g_{i-1}, g_{i-2}, \ldots, g_2, g_1$, and $g_0$, and the associated number has bit values $b_i, b_{i-1}, b_{i-2}, \ldots, b_2, b_1$, and $b_0$.

* * * * *